(12) United States Patent
Kim

(10) Patent No.: US 8,865,501 B2
(45) Date of Patent: Oct. 21, 2014

(54) METHOD OF FABRICATING THERMOELECTRIC MATERIAL AND THERMOELECTRIC MATERIAL FABRICATED THEREBY

(71) Applicant: Korea Institute of Machinery and Materials, Daejeon (KR)

(72) Inventor: Kyung Tae Kim, Busan (KR)

(73) Assignee: Korea Institute of Machinery and Materials, Daejeon (KR)

( * ) Notice: Subject to any disclaimer, the term of this patent is extended or adjusted under 35 U.S.C. 154(b) by 0 days.

(21) Appl. No.: 13/926,618

(22) Filed: Jun. 25, 2013

(65) Prior Publication Data

US 2014/0004643 A1    Jan. 2, 2014

(30) Foreign Application Priority Data

Jun. 29, 2012 (KR) ........................ 10-2012-0070927

(51) Int. Cl.
 *H01L 35/34* (2006.01)
(52) U.S. Cl.
 CPC ............ *H01L 35/34* (2013.01); *Y10S 977/902* (2013.01)
 USPC ............. 438/54; 438/714; 438/504; 438/795; 438/308; 438/378; 257/108; 257/225; 257/467; 257/470; 136/200; 977/902

(58) Field of Classification Search
 USPC .................. 438/54, 714, 504, 795, 308, 378; 977/902; 257/108, 225, 467, 470
 See application file for complete search history.

(56) References Cited

U.S. PATENT DOCUMENTS

| | | | | |
|---|---|---|---|---|
| 2011/0005564 A1* | 1/2011 | Gruen | ........................... | 136/239 |
| 2011/0284804 A1* | 11/2011 | Kim et al. | ...................... | 252/503 |
| 2013/0171056 A1* | 7/2013 | Plass | ............................. | 423/511 |

FOREIGN PATENT DOCUMENTS

| | | |
|---|---|---|
| KR | 10-2007-0117270 A | 12/2007 |
| KR | 10-2011-0080282 A | 7/2011 |
| KR | 1-2011-0128432 A | 11/2011 |

* cited by examiner

*Primary Examiner* — Zandra Smith
*Assistant Examiner* — Damian A Hillman
(74) *Attorney, Agent, or Firm* — Sheridan Ross P.C.

(57) ABSTRACT

The object of the present invention is to provide a method of fabricating a thermoelectric material and a thermoelectric material fabricated thereby. According to the present invention, since carbon nanotubes with no surface treatment are dispersed in the alloy, electrical resistivity decreases and electrical conductivity increases in comparison to surface-treated carbon nanotubes and an amount of thermal conductivity decreased is the same as that in the case of using surface-treated carbon nanotubes, and thus, a ZT value, a thermoelectric figure of merit, is improved. A separate reducing agent is not used and an organic solvent having reducing powder is used to improve economic factors related to material costs and process steps, and carbon nanotubes may be dispersed in the thermoelectric material without mechanical milling.

6 Claims, 8 Drawing Sheets

Thermoelectric matrix powder

CNT

Thermoelectric nanoparticle

Thermoelectric matrix powder  Thermoelectric nanoparticle

CNT

METHOD OF FABRICATING THERMOELECTRIC MATERIAL AND THERMOELECTRIC MATERIAL FABRICATED THEREBY

CROSS-REFERENCES TO RELATED APPLICATION

This patent application claims the benefit of priority from Korean Patent Application No. 10-2012-0070927, filed on Jun. 29, 2012, the contents of which are incorporated herein by reference.

BACKGROUND OF THE INVENTION

1. Field of the Invention

The present disclosure relates to a method of fabricating a thermoelectric material and a thermoelectric material fabricated thereby.

2. Description of the Related Art

Thermoelectric materials are energy conversion materials in which electric energy is generated when a temperature difference is applied between two ends of the material, and conversely, the temperature difference between the two ends of the material is generated when electric energy is applied. In the beginning of the 19th century, thermoelectric phenomena, such as Seebeck effect, Peltier effect, and Thomson effect, were discovered, and in the late 1930s, thermoelectric materials having a high thermoelectric figure of merit were developed along with the development of semiconductors. In recent years, thermoelectric materials have been used for special power supplies for a mountainous and remote area, space applications, or military applications using thermoelectric power generation, and precision temperature control in semiconductor laser diodes or infrared detectors, computer-related mini coolers, cooling devices for lasers in fiber-optic communication, cooling devices in hot and cold water dispensers, semiconductor thermostats, or heat exchangers using thermoelectric cooling.

Thermoelectric performance, such as power generation capacity and cooling capacity, of a thermoelectric material may be known through a dimensionless figure of merit, $ZT=(\sigma^2\alpha/k)T$ (where $\sigma$ is a Seebeck coefficient, $\alpha$ is electrical conductivity, k is thermal conductivity, and T is absolute temperature). A high thermoelectric figure of merit of a thermoelectric material denotes a high energy conversion efficiency of the thermoelectric material, and in order to increase the thermoelectric figure of merit, electrical conductivity and Seebeck coefficient must be improved and thermal conductivity must be decreased. Therefore, a thermoelectric material requires independent control of properties for obtaining high electrical conductivity and low thermal conductivity.

In general, electrical conductivity and thermal conductivity of a material are interdependent with each other. That is, it is known that a material having high electrical conductivity also has high thermal conductivity. However, with respect to a thermoelectric material, an appropriate combination of high electrical conductivity and low thermal conductivity is required as illustrated in the above thermoelectric figure of merit (ZT). Among parameters influencing the thermoelectric figure of merit, since the Seebeck coefficient and electrical conductivity are mainly dependent on scattering of electric charges and thermal conductivity is mainly dependent on scattering of lattice waves, there is a need to control properties through control of a microstructure in consideration of the above parameters. That is, a decrease in thermal conductivity is induced by decreasing the scattering of electric charges in the thermoelectric material as much as possible and increasing the scattering of phonons constituting the thermoelectric material, and consequently, the thermoelectric figure of merit may be improved.

Recently, research into nanocrystallization of thermoelectric materials and fabricating thermoelectric materials including a nanophase has been actively conducted in order to fabricate thermoelectric materials having a high thermoelectric figure of merit (ZT). That is, the reason for this is that since new interfaces between dispersed phase/thermoelectric phase formed by grain boundaries of the thermoelectric material and the dispersed phase may induce active phonon scattering by introducing the dispersed phase with nanometer scale into a thermoelectric matrix material, thermal conductivity may be effectively reduced, and thus, the thermoelectric figure of merit (ZT) may be effectively improved. Since the wavelength of phonons is in a range of 1 nm to 2 nm and the wavelength of electrons is in a range of 10 nm to 50 nm, thermal conductivity may be effectively decreased while electrical conductivity is maintained, when a nanomaterial having a size of 10 nm or less is used. That is, since the movement of carriers may not be greatly affected when the size of the dispersed phase (nanomaterial) is 10 nm or less, the decrease in electrical conductivity due to the introduction of the dispersed phase may be addressed. Therefore, research for improving a thermoelectric figure of merit by fabricating an inner-type thermoelectric material, in which a nano-dispersed phase exists in grains of the thermoelectric matrix material, has been continued.

"Method of preparing thermoelectric material by mechanical milling-mixing method" was disclosed in Korean Patent No. 10-0795194. The above patent provides a method of preparing a thermoelectric material having controlled thermal/electrical characteristics through mechanical milling of a thermoelectric material into different sizes, and mixing, forming, and sintering processes of the milled thermoelectric material, and the thermoelectric material thus prepared. The patent has advantages in terms of polycrystallization and nanostructurization of a single material. However, according to the above-described invention, since it is difficult to prevent agglomeration of nanoscale fine dispersed phases by mechanical mixing and the dispersed phases exist on surfaces of bismuth telluride metal powder rather than exist in the powder, the patent may not be used for fabricating a thermoelectric material using a nano-dispersed phase that is aimed in the present invention.

"Thermoelectric material and composite material using the same as a raw material, and method of preparing the thermoelectric and composite materials" was disclosed in Korean Patent Application Laid-Open Publication No. 10-2011-0128432. The above patent describes a method of preparing a thermoelectric material, in which a first solution having carbon nanotubes dispersed therein and a second solution having a metal salt mixed therein are mixed, a mixed powder generated by a chemical reaction is then mechanically milled, mixed and heat treated to prepare a thermoelectric material having a portion of the carbon nanotubes inserted thereinto, and a thermoelectric composite material is prepared by a spark plasma sintering process of the thermoelectric material. However, the above method has limitations in that the preparation process is complicated because a pre-treatment process of carbon nanotubes and a post-treatment process of milling and mixing the prepared mixed powder are included, electrical conductivity is decreased due to damages in surface structures of the carbon nanotubes, and electrical conductivity of the carbon nanotubes is decreased in the thermoelectric material because the thermoelectric material is prepared by using carbon nanotubes subjected to the pre-treatment process including an acid treatment.

Therefore, research into minimizing processes, such as a milling process and an acid treatment, and directly synthesizing a thermoelectric material powder having carbon nanotubes uniformly dispersed therein from a metal salt has been continuously conducted.

Accordingly, during research into a method able to improve a thermoelectric figure of merit of a thermoelectric material, the present inventors found that when carbon nanotubes with no acid treatment are used, the thermoelectric figure of merit of the thermoelectric material may be improved due to an increase in electrical conductivity and a decrease in thermal conductivity, thereby leading to completion of the present invention.

PRIOR ART DOCUMENTS

Patent Document

Korean Patent No. 10-0795194 (Registration Date: Jan. 9, 2008)
Korean Patent Application Laid-Open Publication No. 10-2011-0128432 (Publication Date: Nov. 30, 2011)

SUMMARY OF THE INVENTION

One object of the present invention is to provide a method of fabricating a thermoelectric material and a thermoelectric material fabricated thereby.

In order to achieve the object, the present invention provides a method of fabricating a thermoelectric material including: preparing a colloidal solution having carbon nanotubes dispersed therein (step 1); adding a metal salt having thermoelectric properties to the colloidal solution prepared in step 1 (step 2); and precipitating and growing an alloy on outer surfaces of the carbon nanotubes from the metal salt by a chemical reaction of the solution having the metal salt added thereto (step 3).

The present invention also provides a thermoelectric material that is fabricated by the above method and has a form in which carbon nanotubes are dispersed in the alloy or a portion of the carbon nanotubes is inserted into the alloy.

Furthermore, the present invention provides a thermoelectric material that is fabricated by the above method and has a form in which a plurality of alloy particles are connected by carbon nanotubes.

The present invention also provides a thermoelectric composite material fabricated by sintering the thermoelectric material.

According to the present invention, carbon nanotubes with no functionalized surface treatment using strong acid are dispersed in an alloy having thermoelectric properties as a second phase, and thus, electrical conductivity of a fabricated thermoelectric composite material increases as electrical resistivity of the thermoelectric composite material decreases in comparison to a thermoelectric composite material using carbon nanotubes with the functionalized surface treatment. Also, an amount of thermal conductivity decreased may be the same as that in the case of using the surface-treated carbon nanotubes, and thus, a ZT value, a thermoelectric figure of merit, may be improved. An organic solvent having reducing power is used and a reducing agent is not additionally introduced in a fabrication process to improve economic factors related to material costs, carbon nanotubes may be dispersed in the thermoelectric material without mechanical milling as nuclei of an alloy are generated on outer surfaces of the carbon nanotubes uniformly dispersed in a colloidal solution and grow therefrom, and a thermoelectric composite material may be eventually obtained by sintering the thermoelectric material.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Features and advantages of the present invention will be more clearly understood by the following detailed description of the present preferred embodiments by reference to the accompanying drawings. It is first noted that terms or words used herein should be construed as meanings or concepts corresponding with the technical sprit of the present invention, based on the principle that the inventor can appropriately define the concepts of the terms to best describe his own invention. Also, it should be understood that detailed descriptions of well-known functions and structures related to the present invention will be omitted so as not to unnecessarily obscure the important point of the present invention.

The object of the present invention is to provide a method of fabricating a thermoelectric material and a thermoelectric material fabricated thereby. For this purpose, the present invention provides a method of fabricating a thermoelectric material having an improved thermoelectric figure of merit by including carbon nanotubes with no surface treatment at grain boundaries of an alloy, and a thermoelectric material fabricated thereby and a thermoelectric composite material.

The present invention provides a method of fabricating a thermoelectric material including:

preparing a colloidal solution having carbon nanotubes dispersed therein (step 1);

adding a metal salt having thermoelectric properties to the colloidal solution prepared in step 1 (step 2); and precipitating and growing an alloy on outer surfaces of the carbon nanotubes from the metal salt by a chemical reaction of the solution having the metal salt added thereto (step 3).

Figure 1:
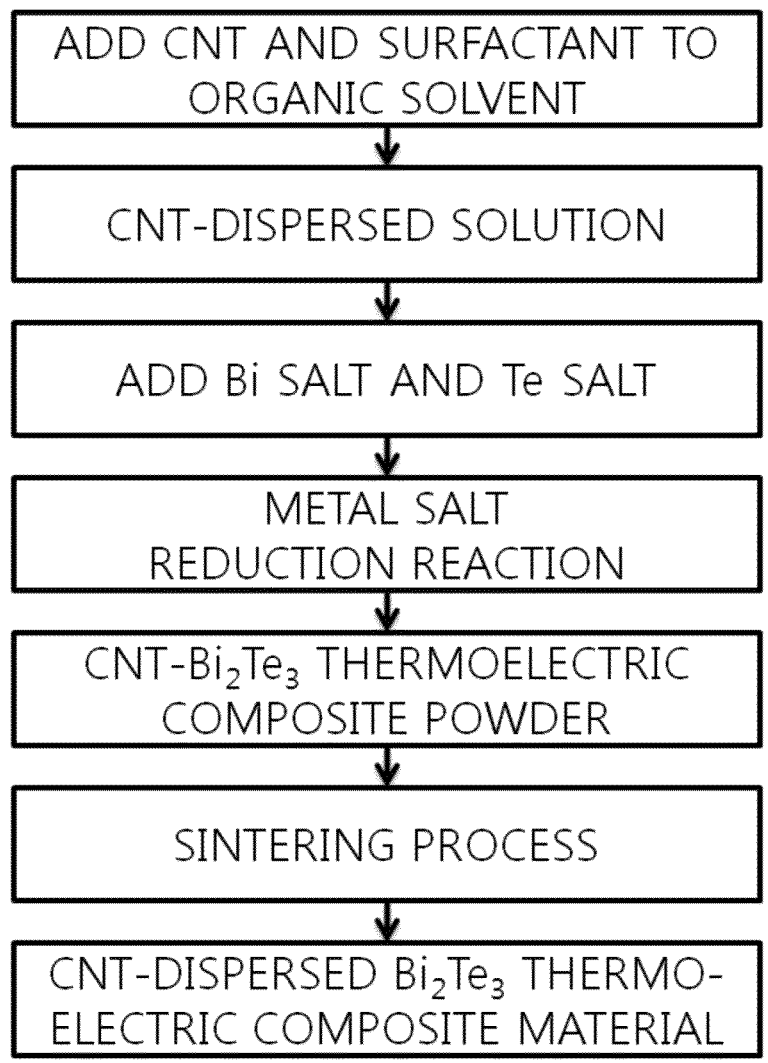
FIG. 1 is a flowchart illustrating a fabrication process of a carbon nanotube (CNT)-$Bi_2Te_3$ thermoelectric material of Example 1 according to the present invention.

Hereinafter, the present invention will be described in detail for each step. The steps may be referred to FIG. 1 below. FIG. 1 is a flowchart illustrating a method of fabricating a thermoelectric material according to the present invention.

In the method of fabricating a thermoelectric material according to the present invention, step 1 is preparing a colloidal solution having carbon nanotubes dispersed therein.

Since the carbon nanotubes are dispersed at grain boundaries of an alloy generated in a subsequent step, new interfaces formed by the carbon nanotubes and thermoelectric phases may prevent the movement of phonons and increase scattering to effectively decrease thermal conductivity.

Also, since carbon nanotubes do not greatly affect electrical conductivity due to characteristics of passing electric charges, the carbon nanotubes may increase a thermoelectric figure of merit.

When the colloidal solution having carbon nanotubes dispersed therein is prepared and the alloy having thermoelectric properties is then reduced by introducing the metal salt, the carbon nanotubes may be uniformly dispersed in the thermoelectric material. Therefore, a thermoelectric material may be obtained, in which the thermoelectric figure of merit (ZT) is uniformly increased in all parts of the thermoelectric material.

In the method of fabricating a thermoelectric material according to the present invention, the carbon nanotubes with no surface treatment may be used.

Typical thermoelectric materials may decrease thermal conductivity by inducing scattering effects of phonons using an oxide-based, nano-dispersed phase, such as $ZrO_2$ or $Al_2O_3$, but may also decrease electrical conductivity, and eventually, it may be difficult to improve the thermoelectric figure of merit (ZT). Accordingly, carbon nanotubes as a conductive nano-dispersed phase have been suggested as an alternative. However, since carbon nanotubes have characteristics of agglomerating one another, there may be limitations in fabricating a thermoelectric material having carbon nanotubes uniformly dispersed therein. Therefore, when the surfaces of the carbon nanotubes are functionalized by a strong acid treatment for the dispersion of the carbon nanotubes, the electrical conductivity of the carbon nanotubes may decrease.

According to the present invention, the colloidal solution having carbon nanotubes with no strong acid treatment uniformly dispersed therein is prepared and the alloy having thermoelectric properties on the outer surfaces of the carbon nanotubes is then reduced by introducing the metal salt, and thus, a decrease in the electrical conductivity of the carbon nanotubes and the agglomeration of the carbon nanotubes may be prevented.

According to the foregoing method, thermoelectric matrix powder is directly formed on the carbon nanotubes and thus, there is no need to further perform a mechanical milling process. When a surface acid treatment or a mechanical milling process is added, graphite structures on the surfaces of the carbon nanotubes may be destroyed, and thus, electrical conductivity may decrease. Therefore, since electrical resistivity of the thermoelectric material using carbon nanotubes with no surface treatment according to the present invention is lower than that of a thermoelectric material using carbon nanotubes surface treated with strong acid, the electrical conductivity thereof increases. Also, since new interfaces formed by the carbon nanotubes dispersed in the thermoelectric material prevent the movement of phonons and scatter the phonons, the thermal conductivity thereof decreases. Eventually, a thermoelectric material having an improved thermoelectric figure of merit (ZT) may be obtained.

In the method of fabricating a thermoelectric material according to the present invention, the carbon nanotubes may be multi-walled carbon nanotubes. The multi-walled carbon nanotubes are carbon nanotubes formed of many concentric graphite tubes, and the multi-walled carbon nanotubes are advantageous in that structural stability is higher in comparison to single-walled or double-walled carbon nanotubes, because sound graphite structures of other layers in the multi-walled carbon nanotubes may remain even in the case that some surface structures of the carbon nanotubes are deformed or destroyed.

In the method of fabricating a thermoelectric material according to the present invention, step 1 may be performed by introducing carbon nanotubes with a surfactant into an organic solvent having reducing power. A colloidal solution having carbon nanotubes uniformly dispersed therein may be prepared by introducing the carbon nanotubes and the surfactant into the organic solvent. Also, metal salts introduced in a subsequent step may be reduced by using the organic solvent having reducing powder to form an alloy having thermoelectric properties, and thus, the method may be advantageous in that economic factors in processing are better than a typical method of further adding a reducing agent.

In the method of fabricating a thermoelectric material according to the present invention, the organic solvent may be 1-dodecanethiol. Since the organic solvent has reducing power, the organic solvent may be used as a reducing agent as well as a solvent.

In the method of fabricating a thermoelectric material according to the present invention, the surfactant may be one selected from the group consisting of oleylamine (OLA), trioctylphosphine (TOP), and oleic acid.

In the method of fabricating a thermoelectric material according to the present invention, step 2 is adding a metal salt having thermoelectric properties to the colloidal solution prepared in step 1. The metal salt used in step 2 may be one or more selected from the group consisting of bismuth (Bi) acetate, Bi chloride, and $BiNO_3$, and tellurium (Te) chloride. Bismuth telluride ($Bi_2Te_3$) is a representative material having thermoelectric properties at room temperature, in which bismuth ions and tellurium ions included in the metal salts may be reduced by the solvent having reducing power to form bismuth telluride.

In the method of fabricating a thermoelectric material according to the present invention, antimony chloride or selenium chloride may be further added to the colloidal solution in step 2. A p-type thermoelectric material may be formed by further adding an antimony salt such as antimony chloride, and an n-type thermoelectric material may be formed by further adding selenium chloride.

In the method of fabricating a thermoelectric material according to the present invention, step 3 is precipitating and growing an alloy on outer surfaces of the carbon nanotubes from the metal salt by a chemical reaction of the solution having the metal salt added thereto. When the solution having the metal salt added thereto is heated for a predetermined period of time, the metal salt is reduced to generate and precipitate nuclei of the alloy on the outer surfaces of the carbon nanotubes, and the generated nuclei gradually grow to form a nano-sized thermoelectric material. The fabricated thermoelectric material by itself is prepared as a paste and the paste may then be used in the fabrication of a thermoelectric device, and the fabricated thermoelectric material may be sintered to be used as a thermoelectric composite material.

In the method of fabricating a thermoelectric material according to the present invention, the chemical reaction in step 3 may be performed at a temperature ranging from 100° C. to 150° C. for 1 hour to 3 hours. In a case where the heating is performed at a temperature outside the temperature range, a reduction reaction, in which bismuth atoms and tellurium atoms are reduced from a bismuth salt and a tellurium salt, may be difficult to be controlled. In a case where the heating is performed less than 1 hour, the reduction reaction, in which bismuth atoms and tellurium atoms are reduced, may not be completely performed to decrease a fabrication yield of the thermoelectric material, and in a case where the heating is performed greater than 3 hours, unnecessary time and costs may be required. Therefore, the heating may be performed by appropriately selecting the time and temperature of the chemical reaction within the above temperature and time ranges so as to control particle shape and size of the fabricated thermoelectric material.

Figure 2:
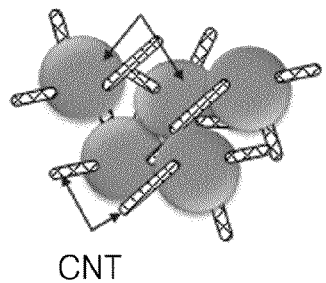
FIG. 2 is a conceptual view illustrating a CNT-$Bi_2Te_3$ thermoelectric material fabricated according to the present invention.
Figure 2:
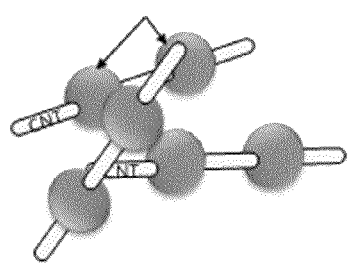

Also, the present invention provides a thermoelectric material that is fabricated by the above fabrication method and has a form in which carbon nanotubes are dispersed in the alloy or a portion of the carbon nanotubes is inserted into the alloy. Different from a typical method of mechanically dispersing a nanomaterial in a thermoelectric material, since the thermoelectric material grows on the outer surfaces of the nanomaterial, the fabrication method according to the present invention may address the agglomeration of the nanomaterial. Therefore, a thermoelectric material having the form, in which carbon nanotubes are dispersed in the alloy or a portion of the carbon nanotubes is inserted into the alloy, may be generated. The fabricated thermoelectric material by itself is prepared as a paste and the paste may then be used in the fabrication of a thermoelectric device, and the fabricated thermoelectric material may be used as a raw material for fabricating a sintered thermoelectric material through a sintering process (see FIG. 2).

Also, the present invention provides a thermoelectric material that is fabricated by the above fabrication method and has a form in which a plurality of alloy particles are connected by carbon nanotubes. Different from the typical method of mechanically dispersing a nanomaterial in a thermoelectric material, since the thermoelectric material grows on the outer surfaces of the nanomaterial, the fabrication method according to the present invention may address the agglomeration of the nanomaterial. Therefore, a thermoelectric material having the form, in which the plurality of alloy particles are connected by carbon nanotubes, may be generated. The fabricated thermoelectric material by itself is prepared as a paste and the paste may then be used in the fabrication of a thermoelectric device, and the fabricated thermoelectric material may be used as a raw material for fabricating a sintered thermoelectric material through a sintering process (see FIG. 2).

In the thermoelectric material according to the present invention, the alloy may include Te and Bi. Bismuth telluride synthesized from a tellurium salt and a bismuth salt is a representative material having thermoelectric properties at room temperature, in which a bismuth telluride-based thermoelectric material having carbon nanotubes uniformly dispersed therein may be fabricated according to the fabrication method of the present invention.

In the thermoelectric material according to the present invention, the alloy may further include selenium (Se) and antimony (Sb). A thermoelectric material further including Se becomes an n-type ternary thermoelectric semiconductor and a thermoelectric material further including Sb becomes a p-type ternary thermoelectric semiconductor.

In the thermoelectric material according to the present invention, a volume fraction of the carbon nanotubes included may be in a range of 0.5% to 10% based on a total volume of the thermoelectric material. In a case where the volume fraction of the carbon nanotubes is less than 0.5%, since an amount of the carbon nanotubes included in the thermoelectric material is small, the thermoelectric figure of merit may not be sufficiently increased. In a case where the volume fraction of the carbon nanotubes is greater than 10%, a large amount of the carbon nanotubes is included in the thermoelectric material, and thus, the carbon nanotubes may agglomerate one another in the thermoelectric material.

Furthermore, the present invention provides a thermoelectric composite material fabricated by sintering the thermoelectric material. A bulk thermoelectric composite material may be fabricated by sintering the thermoelectric material under high temperature and pressure. Since a dispersion state of the carbon nanotubes in the thermoelectric material is continuously maintained after the sintering, the thermoelectric composite material exhibits an excellent thermoelectric figure of merit (ZT).

Hereinafter, the present invention will be described in more detail according to examples. However, the following examples are provided for illustrative purposes only, and the scope of the present invention should not be limited thereto in any manner.

Example 1

Step 1: 1 mg of carbon nanotubes (diameter: 10 nm to 40 nm, length: average 5 μm, Hanwha Nanotech) was introduced with 9 ml of oleylamine as a surfactant into 4.5 ml of 1-dodecanethiol to prepare a colloidal solution having carbon nanotubes dispersed therein.

Step 2: 0.153 g of bismuth acetate [$Bi(CH_3COO)_3$] and 0.162 g of tellurium chloride [$TeCl_4$] (Sigma Aldrich Co., Ltd.) as metal salts having thermoelectric properties were added to the colloidal solution prepared in step 1.

Step 3: a chemical reaction was performed by heating the solution having the metal salts added thereto at 110° C. for 2 hours to precipitate $Bi_2Te_3$ on outer surfaces of the carbon nanotubes and thus, a thermoelectric material was fabricated.

Comparative Example 1

A thermoelectric material was fabricated in the same manner as Example 1 except that carbon nanotubes were not added in step 1 of Example 1.

Comparative Example 2

A thermoelectric material was fabricated in the same manner as Example 1 except that carbon nanotubes were purified by dipping in an HCl solution, an ultrasonic treatment was then performed on the purified carbon nanotubes by adding to a solution, in which sulfuric acid and nitric acid were mixed at a volume ratio of 3:1, to form a functional group such as a carboxylic group, and carbon nanotubes separated by centrifugation and filtering were used in Example 1.

Experimental Example 1

Scanning Electron Microscope Analysis

The thermoelectric material fabricated in Example 1 according to the present invention was observed by using a scanning electron microscope (MIRA II LMH, TESCAN) and the results thereof are presented in FIG. 3 below.

Figure 3:
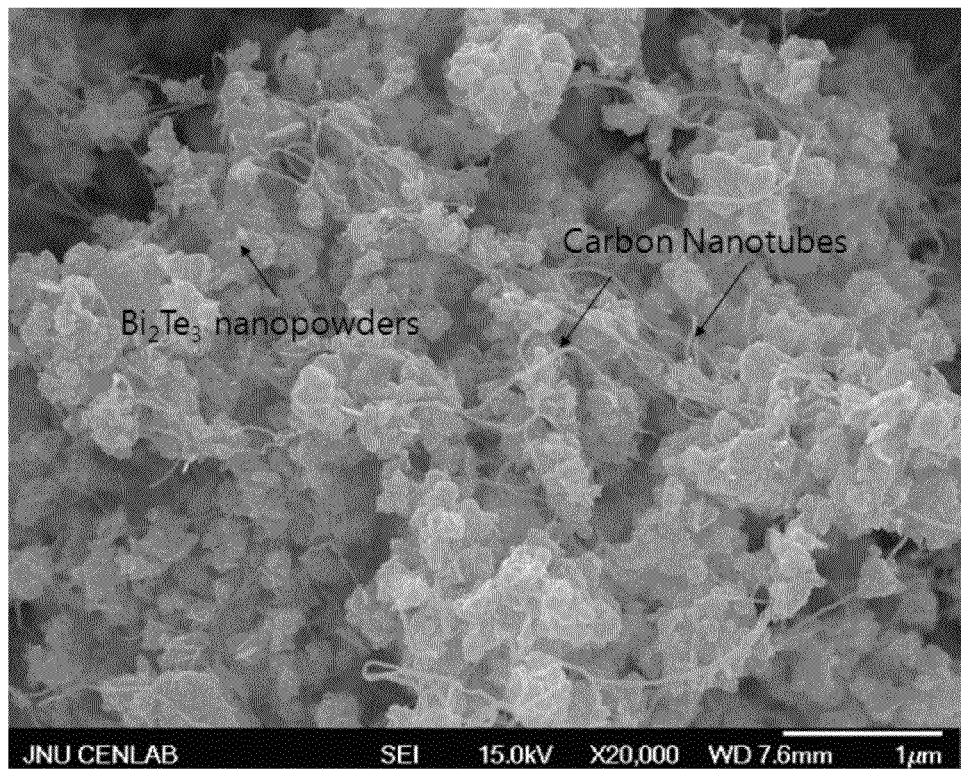
FIG. 3 is a scanning electron microscope image of the CNT-$Bi_2Te_3$ thermoelectric material of Example 1 according to the present invention.

Referring to FIG. 3, it may be confirmed that the thermoelectric material fabricated in Example 1 was generated in a form in which a plurality of bismuth telluride particles with a size of a few hundred nanometers were connected by carbon nanotubes.

Experimental Example 2

Transmission Electron Microscope Analysis 1

The thermoelectric material fabricated in Example 1 according to the present invention was observed by using a transmission electron microscope (HR-TEM, 200 KV, JEM2100F, JEOL) and the results thereof are presented in FIG. 4 below.

Figure 4:
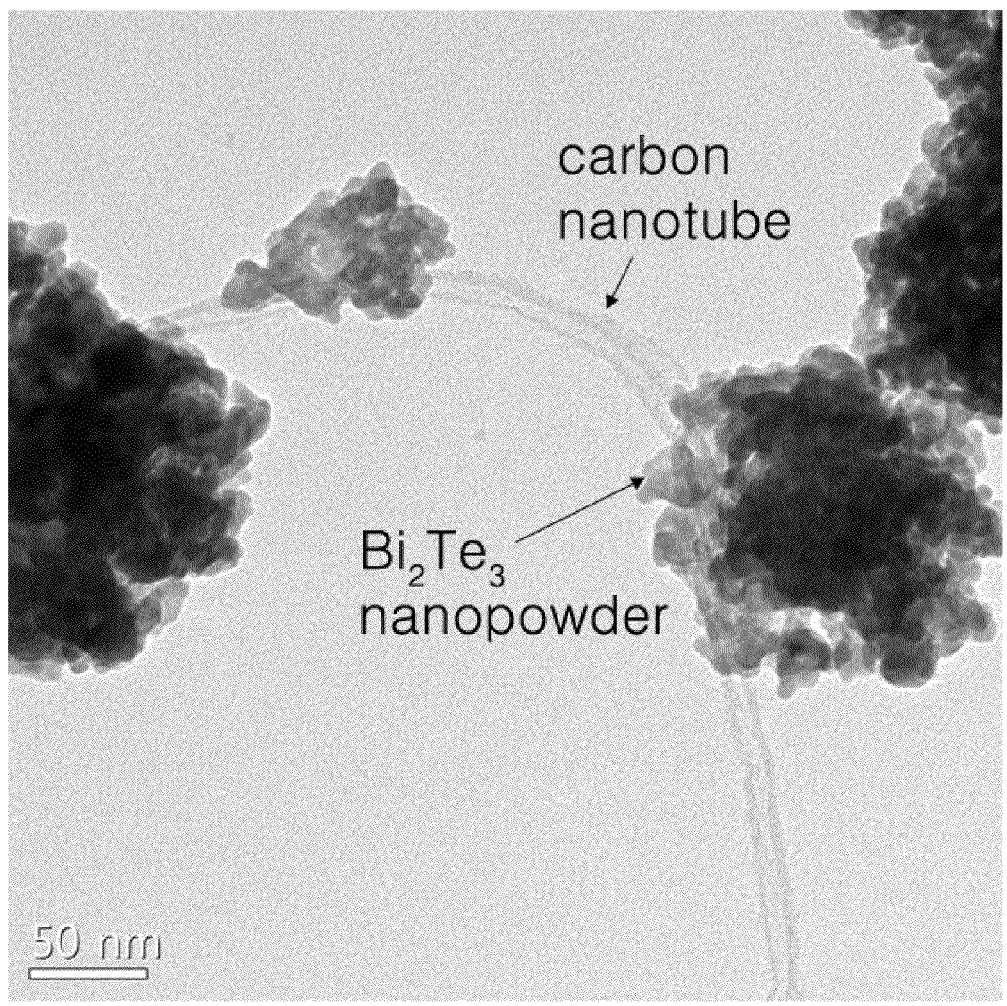
FIG. 4 is a transmission electron microscope image of the CNT-$Bi_2Te_3$ thermoelectric material of Example 1 according to the present invention.

Referring to FIG. 4, it may be confirmed that the thermoelectric material fabricated in Example 1 was in a form in which carbon nanotubes passed through bismuth telluride nanopowder. Therefore, it may be understood that bismuth telluride particles were generated by precipitating on the outer surfaces of the carbon nanotubes.

Experimental Example 3

Transmission Electron Microscope Analysis 2

A thermoelectric composite material fabricated by sintering the thermoelectric material fabricated in Example 1 according to the present invention was observed by using the transmission electron microscope (HR-TEM, 200 KV, JEM2100F, JEOL) and the results thereof are presented in FIG. 5 below.

Figure 5:
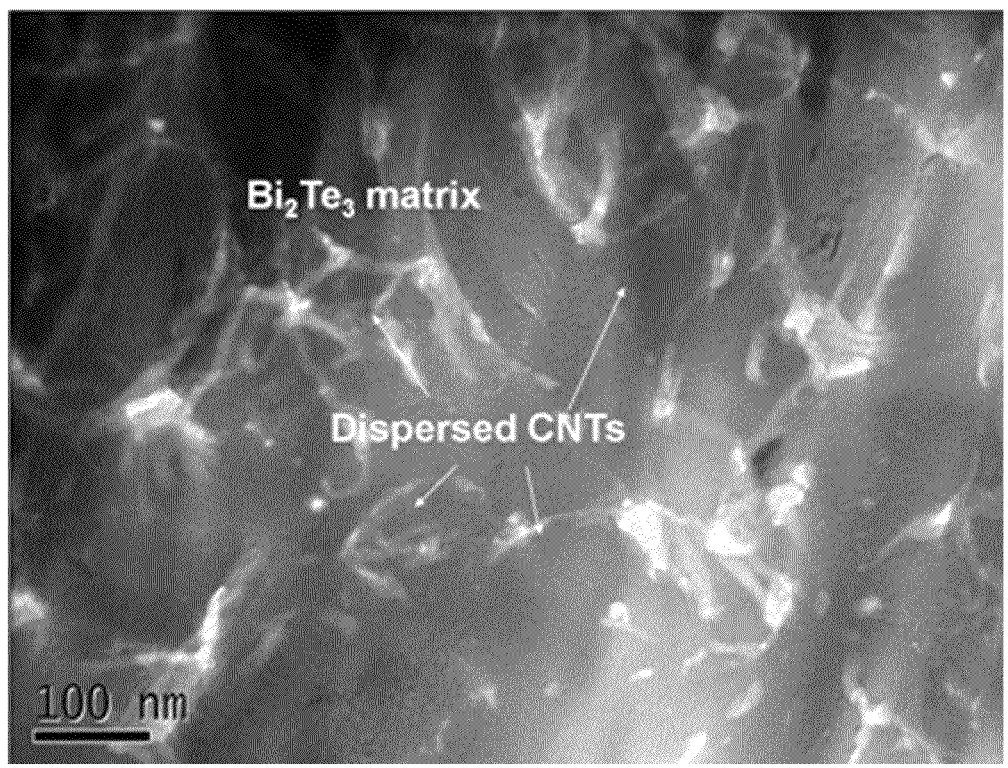
FIG. 5 is a transmission electron microscope image of a CNT-$Bi_2Te_3$ thermoelectric composite material of Example 1 according to the present invention.

Referring to FIG. 5, it may be confirmed that carbon nanotubes were dispersed in a matrix formed of $Bi_2Te_3$ in the thermoelectric composite material using the thermoelectric material fabricated in Example 1.

Experimental Example 4

X-Ray Diffraction Analysis

X-ray diffraction analysis was performed on the thermoelectric material fabricated in Example 1 according to the present invention by using an X-ray diffractometer (X'pert MPD) and the results thereof are presented in FIG. 6 below.

Figure 6:
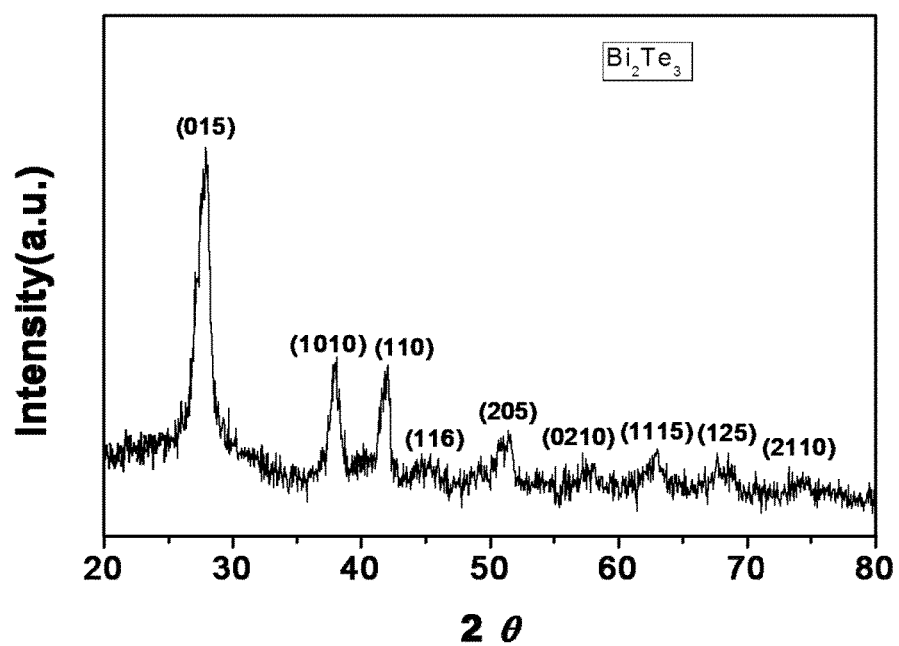
FIG. 6 is an X-ray diffraction pattern of the CNT-$Bi_2Te_3$ thermoelectric material of Example 1 according to the present invention.

Referring to FIG. 6, crystal planes matched with JCPDS number 15-0963, a standard value of $Bi_2Te_3$, and thus, it may be understood that the thermoelectric material fabricated in Example 1 was formed of $Bi_2Te_3$. The reason for this is that Bi and Te ions precipitated as atoms by the solvent having reducing power, and nuclei of bismuth telluride powder were generated and grew on the outer surfaces of the carbon nanotubes. Therefore, it may be understood that a thermoelectric material formed of bismuth telluride having carbon nanotubes dispersed therein was fabricated.

Experimental Example 5

Comparison of Thermal Conductivity Characteristics

Thermoelectric composite materials were fabricated by sintering the thermoelectric materials fabricated in Comparative Examples 1 and 2 and Example 1 according to the present invention at 350° C. for 10 minutes using a spark plasma sintering process, and thermal conductivities thereof were analyzed.

At this time, thermal diffusivity ($\alpha$, m²/s) was measured for each sample by a laser flash method, and the thermal conductivity (W/m·K) was then calculated by substituting the measured thermal diffusivity, specific heat ($C_p$, J/(kg·K)), and density ($\rho$, kg/m³) into the following Equation 1. The results thereof are presented in FIG. 7 below.

$$\text{Thermal conductivity (W/mK)} = \alpha \rho C_p \qquad \text{<Equation 1>}$$

Figure 7:
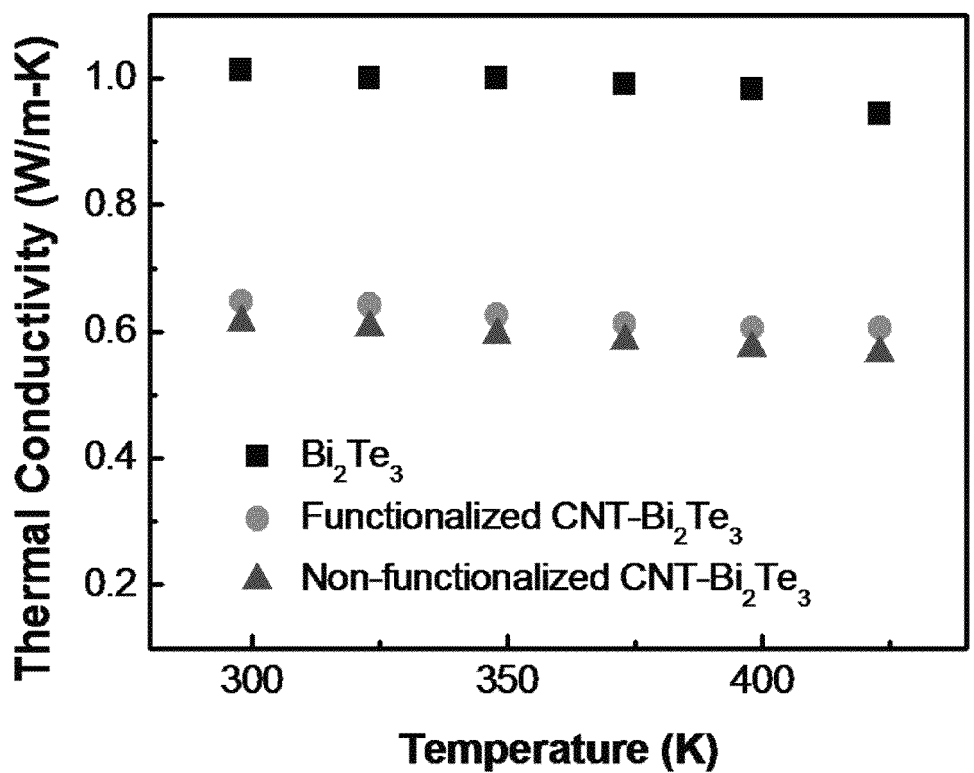
FIG. 7 is a graph illustrating thermal conductivity vs. temperature of the CNT-$Bi_2Te_3$ thermoelectric material of Example 1 according to the present invention.

Referring to FIG. 7, it may be confirmed that the thermoelectric composite material using the thermoelectric material fabricated in Example 1 exhibited lower thermal conductivity than the thermoelectric composite material using the thermoelectric material fabricated in Comparative Example 1 in all temperature ranges in which experiments had been performed. That is, since the thermoelectric figure of merit of a thermoelectric material increases as thermal conductivity decreases, it may be understood that the thermoelectric material fabricated in Example 1 exhibited a higher thermoelectric figure of merit than the thermoelectric material fabricated in Comparative Example 1 in all temperature ranges in which experiments had been performed.

Also, it may be confirmed that the thermoelectric composite materials using the thermoelectric materials fabricated in Example 1 and Comparative Example 2 exhibited almost same thermal conductivity in all temperature ranges in which experiments had been performed. Therefore, it may be confirmed that thermal conductivities of the thermoelectric composite materials having carbon nanotubes added thereto were almost same regardless of a surface treatment for functionalizing the carbon nanotubes with strong acid.

Experimental Example 6

Comparison of Electrical Resistivity Characteristics

Thermoelectric composite materials were fabricated by sintering the thermoelectric materials fabricated in Comparative Examples 1 and 2 and Example 1 according to the present invention at 350° C. for 10 minutes using a spark plasma sintering process, and electrical resistivities thereof were measured at a temperature ranging from 298 K to 423 K using a ZEM-3 (Ulvac-Rico) instrument. The results thereof are presented in FIG. 8 below.

Figure 8:
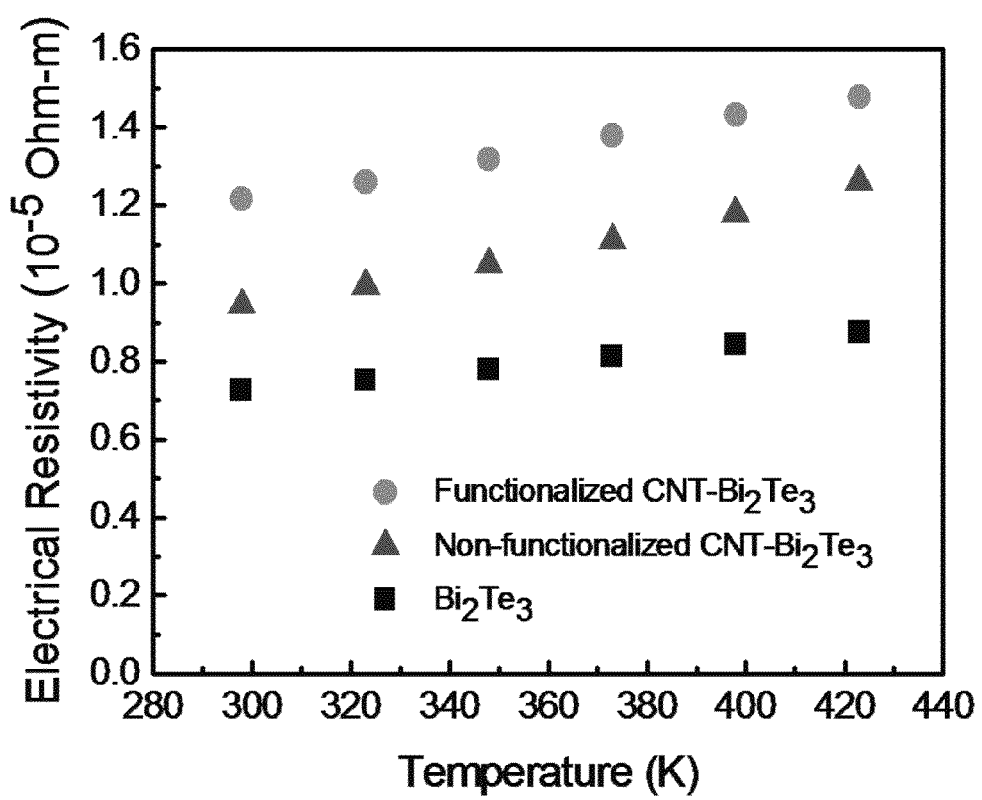
FIG. 8 is a graph illustrating electrical resistivity vs. temperature of the CNT-$Bi_2Te_3$ thermoelectric material of Example 1 according to the present invention.

Referring to FIG. 8, it may be confirmed that the electrical resistivities of the thermoelectric composite powders using the thermoelectric materials fabricated in Example 1 of the present invention and Comparative Example 2 were higher than the electrical resistivity of the thermoelectric composite powder using the thermoelectric material fabricated in Comparative Example 1 in all temperature ranges in which experiments had been performed. Therefore, it may be understood that electrical conductivity of the bismuth telluride thermoelectric composite material having carbon nanotubes inserted thereinto was lower than that of the bismuth telluride thermoelectric composite material not having carbon nanotubes inserted thereinto.

Also, it may be confirmed that electrical resistivity of the thermoelectric composite material using the thermoelectric material fabricated in Example 1 of the present invention was lower than that of the thermoelectric composite material using the thermoelectric material fabricated in Comparative Example 2 in all temperature ranges in which experiments had been performed. Since the electrical conductivity of the bismuth telluride thermoelectric composite material having carbon nanotubes with no surface treatment according to the present invention inserted thereinto was higher than that of the thermoelectric composite material having surface-treated carbon nanotubes inserted thereinto, it may be understood that the thermoelectric figure of merit (ZT) of the thermoelectric material fabricated according to the present invention was better.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a thermoelectric material, the method comprising:
    preparing a colloidal solution having carbon nanotubes dispersed therein (step 1);
    adding a metal salt having thermoelectric properties to the colloidal solution prepared in step 1 (step 2);
    precipitating and growing an alloy on outer surfaces of the carbon nanotubes from the metal salt by a chemical reaction of the solution having the metal salt added thereto (step 3),
    wherein the carbon nanotubes with no surface treatment are used,
    wherein step 1 is performed by introducing carbon nanotubes with a surfactant into 1-dodecanethiol having reducing power, and
    wherein the chemical reaction in step 3 is performed at a temperature ranging from 100° C. to 150° C. for 1 hour to 3 hours.

2. The method as set forth in claim 1, wherein the carbon nanotubes are multi-walled carbon nanotubes.

3. The method as set forth in claim 1, wherein the surfactant is one selected from the group consisting of oleylamine, trioctylphosphine (TOP), and oleic acid.

4. The method as set forth in claim 1, wherein the metal salt in step 2 comprises one or more selected from the group consisting of bismuth (Bi) acetate, Bi chloride, and $BiNO_3$, and tellurium (Te) chloride.

5. The method as set forth in claim 1, wherein antimony chloride or selenium chloride is further added to the colloidal solution in step 2.

6. The method as set forth in claim 1, wherein an inner surface of the carbon nanotubes is free of the alloy.

* * * * *